United States Patent
Yan et al.

(10) Patent No.: US 9,433,125 B2
(45) Date of Patent: Aug. 30, 2016

(54) HEAT-DISSIPATING TYPE OF POWER CONVERTER

(71) Applicant: DELTA ELECTRONICS, INC., Taoyuan Hsien (TW)

(72) Inventors: Kaitian Yan, Taoyuan Hsien (TW); Bagao Li, Taoyuan Hsien (TW); Xu Wang, Taoyuan Hsien (TW)

(73) Assignee: DELTA ELECTRONICS, INC. (TW)

(*) Notice: Subject to any disclaimer, the term of this patent is extended or adjusted under 35 U.S.C. 154(b) by 288 days.

(21) Appl. No.: 13/846,728

(22) Filed: Mar. 18, 2013

(65) Prior Publication Data
US 2014/0063738 A1    Mar. 6, 2014

(30) Foreign Application Priority Data

Aug. 30, 2012    (CN) .......................... 2012 1 0316049

(51) Int. Cl.
*H05K 7/20*    (2006.01)

(52) U.S. Cl.
CPC ........ *H05K 7/20154* (2013.01); *H05K 7/20918* (2013.01)

(58) Field of Classification Search
CPC .......... H05K 7/20; G05F 1/561; H02K 47/02; H02K 47/04; H02K 47/06; H02K 47/12; H02K 47/18; H02K 47/22; H02K 47/30
USPC ................. 361/678–700, 724–727; 312/223.1–223.3; 454/185, 256, 329
See application file for complete search history.

(56) References Cited

U.S. PATENT DOCUMENTS 6,262,906 B1 * 7/2001 Salzmann ............ H05K 7/1432
                                              363/141
6,693,371 B2 * 2/2004 Ziegler .................... H02J 9/062
                                              307/64

(Continued)

FOREIGN PATENT DOCUMENTS

| CN | 1533688 | 9/2004 |
|---|---|---|
| CN | 101699733 | 4/2010 |

(Continued)

OTHER PUBLICATIONS

Office Action dated Feb. 25, 2015 from corresponding No. TW 101138887.

(Continued)

*Primary Examiner* — Anthony Haughton
*Assistant Examiner* — Matt Dhillon
(74) *Attorney, Agent, or Firm* — Hauptman Ham, LLP

(57) ABSTRACT

A heat-dissipating type of power converter comprises a support unit, at least one power module, at least one pair of rails and at least one main air duct module corresponding to the at least one power module. The pair of rails are fixed to the support unit and parallel to each other. The power module comprises a mounting plate module, a power unit and a radiator. wherein the power unit is fixed to the radiator, and the mounting plate module and the radiator are fixedly connected to each other. the main air duct module is fixed to the support unit and provided between the pair of rails, a second opening is defined in a side of the main air duct module toward the power module. The power module is assembled with or disassembled from the main air duct module by sliding along the pair of rails. Wherein after the power module is assembled with the main air duct module, the radiator is plugged into the main air duct module through the second opening, the power unit is positioned outside the main air duct module, and the main air duct with a sealed sidewall is defined by the mounting plate module, the radiator and the main air duct module.

20 Claims, 19 Drawing Sheets

(56) References Cited

U.S. PATENT DOCUMENTS

| | | | | |
|---|---|---|---|---|
| 6,754,066 B2* | 6/2004 | Doan | H02B 1/32 | 361/600 |
| 6,927,974 B2* | 8/2005 | Robillard | H05K 7/183 | 361/679.4 |
| 7,113,405 B2* | 9/2006 | Armstrong | H05K 7/20909 | 165/80.3 |
| 7,274,573 B2* | 9/2007 | Sevakivi | H05K 7/1432 | 211/183 |
| 7,408,775 B2* | 8/2008 | Walz | H05K 7/20645 | 165/104.33 |
| 8,243,447 B2* | 8/2012 | Fujiki | H05K 7/20909 | 165/185 |
| 8,325,479 B2* | 12/2012 | Siracki | H05K 7/20918 | 361/678 |
| 8,335,081 B2* | 12/2012 | Weiss | H05K 7/20163 | 165/80.3 |
| 8,488,319 B2* | 7/2013 | Santos | H02M 7/003 | 361/695 |
| 8,687,357 B2* | 4/2014 | Nagano | H05K 7/20 | 165/104.33 |
| 8,724,337 B2* | 5/2014 | Teng | H05K 7/1492 | 174/260 |
| 8,773,851 B2* | 7/2014 | Shigeno | H05K 7/20918 | 165/185 |
| 8,797,738 B2* | 8/2014 | Nagano | H02M 7/003 | 174/547 |
| 8,830,658 B2* | 9/2014 | Eichler | H05K 7/1432 | 318/800 |
| 8,837,116 B2* | 9/2014 | Eichler | H05K 7/1432 | 290/44 |
| 8,993,901 B2* | 3/2015 | Yoshida | H05K 7/20909 | 174/542 |
| 2003/0081386 A1* | 5/2003 | Robillard | H01R 13/6315 | 361/724 |
| 2004/0223301 A1* | 11/2004 | Muller | H05K 7/20909 | 361/699 |
| 2011/0057454 A1* | 3/2011 | Kawakita | F02B 63/04 | 290/1 A |
| 2011/0188280 A1* | 8/2011 | Nagano | H05K 7/20 | 363/141 |
| 2011/0255237 A1* | 10/2011 | Doll | H05K 7/20736 | 361/679.46 |
| 2012/0014154 A1 | 1/2012 | Siracki et al. | | |
| 2013/0343110 A1* | 12/2013 | Liu | H05K 7/20909 | 363/141 |
| 2014/0266017 A1* | 9/2014 | Hamada | H01M 10/44 | 320/107 |

FOREIGN PATENT DOCUMENTS

| | | |
|---|---|---|
| CN | 201557042 | 8/2010 |
| CN | 102142766 | 8/2011 |

OTHER PUBLICATIONS

Office Action dated Jul. 24, 2015 from corresponding No. CN 201210316049.9.

* cited by examiner

HEAT-DISSIPATING TYPE OF POWER CONVERTER

CROSS-REFERENCE TO RELATED APPLICATIONS

This application claims benefits of Chinese Patent Application No. 201210316049.9, filed on Aug. 30, 2012 in the State Intellectual Property Office of China, the disclosure of which is incorporated herein by reference in its entirety.

TECHNICAL FIELD

The present disclosure relates to a power converter, particularly to a heat-dissipating type of power converter.

BACKGROUND

Currently, the large-sized or medium-sized power converter is common in the power electronics field. However, the power converter is generally made into a whole and has a large volume and large weight. It is difficult to transport, disassemble, assemble and maintain this power converter.

A high-power voltage source converter is illustrated as an example. It is difficult to design the power portion of the high-power voltage source inverter into a module due to the structure of the main circuit. Even if a modular design is desirable, however, the members of the power module are fixed to the power module in the traditional lock manner, resulting in the less compact structure of the converter and the more messy of wiring. The bulk modules of the converter will further increase the difficulty in the assembling, disassembling or maintenance of the converter. For example, as shown in FIG. 1, as the main parts of the power portion in a traditional high-power voltage source converter, a plurality of IGBT module 12 is separately mounted into the cabinet 7 one by one, and each IGBT module is fixed by four screws 8. The above installation will make trouble in the disassembling, assembling or maintenance of the entire converter.

SUMMARY

The present disclosure provides a heat-dissipating type of power converter with the power module plugged and unplugged freely.

A heat-dissipating type of power converter comprises a support unit, at least one power module, at least one pair of rails and at least one main air duct module corresponding to the at least one power module. The pair of rails are fixed to the support unit and parallel to each other. The power module comprises a mounting plate module, a power unit and a radiator. wherein the power unit is fixed to the radiator, and the mounting plate module and the radiator are fixedly connected to each other. the main air duct module is fixed to the support unit and provided between the pair of rails. A second opening is defined in a side of the main air duct module toward the power module. The power module is assembled with or disassembled from the main air duct module by sliding along the pair of rails. Wherein after the power module is assembled with the main air duct module, the radiator is plugged into the main air duct module through the second opening, the power unit is positioned outside the main air duct module, and the main air duct with a sealed sidewall is defined by the mounting plate module, the radiator and the main air duct module.

According to an embodiment of the present invention, wherein the radiator has a shape of rectangular block with a width direction oriented along the rails.

According to an embodiment of the present invention, wherein the power unit comprises a plurality of power subunits arranged in parallel on a surface of the radiator connected to the mounting plate module.

According to an embodiment of the present invention, wherein the main air duct module has a shape of rectangular block with a width direction oriented along the rails. A length direction perpendicular to the rails and a height direction consistent with a standing direction of the main air duct module. Two parallel side plates are provided along the length direction of the main air duct module. A width of the main air duct module is larger than a width of the radiator.

According to an embodiment of the present invention, wherein the main air duct module comprises a first closure plate and a second closure plate respectively arranged at two opposite sides of the second opening along the height direction of the main air duct module. The first closure plate and the second closure plate are fixed to two side plates of the main air duct module respectively. The second closure plate is fixed to the support unit.

According to an embodiment of the present invention, wherein the mounting plate module comprises a panel having a first opening for the power unit passing through and being fixed to a side of the radiator provided with the power unit. After the radiator is plugged into the main air duct module, overlap regions are defined between the panel and the first and second closure plates, and a fastener is provided at the overlap regions to fix the power module to the main air duct module.

According to an embodiment of the present invention, wherein the mounting plate module further comprises two parallel side mounting plates adjacent to the panel. A distance between two side plates of the main air duct module is larger than that between the two side mounting plates.

According to an embodiment of the present invention, wherein a length of the main air duct module is slightly larger than a sum of the distance between the two side mounting plates and a total thickness of the two side mounting plates. Wherein the two side mounting plates are positioned between two side plates of the main air duct module.

According to an embodiment of the present invention, wherein there are gaps between the upper portion of the second closure plate of the main air duct module and two side plates respectively.

According to an embodiment of the present invention, wherein the mounting plate module further comprises two parallel side mounting plates adjacent to the panel. A distance between two side mounting plates is larger than that between two side plates of the main air duct module.

According to an embodiment of the present invention, wherein the distance between two side mounting plates is slightly larger than a sum of the distance between two side plates of the main air duct module and a total thickness of two side plates. Wherein after the radiator is plugged into the main air duct module, the two side plates of the main air duct module are positioned between the two side mounting plates.

According to an embodiment of the present invention, wherein the mounting plate module comprises a panel and two parallel side mounting plates adjacent to the panel. The panel having a first opening for the power unit passing through and being fixed to a side of the radiator provided with the power unit. Wherein the radiator is mounted between the two side mounting plates.

According to an embodiment of the present invention, wherein one handle is provided to a portion of the panel close to the rails. Another handle is provided to a portion of the panel away from the rails.

According to an embodiment of the present invention, wherein the mounting plate module further comprises two parallel side mounting plates adjacent to the panel. A distance from two side mounting plates to a plane defined by the rails is less than that from the panel to the plane defined by the rails.

According to an embodiment of the present invention, wherein the power converter further comprises at least one fan. The fan and the main air duct module being mounted to two opposite sides of the support unit. At least one third opening is defined in the support unit for conducting an airflow into the main air duct module by the fan.

According to an embodiment of the present invention, wherein the power unit is a voltage source converter.

According to an embodiment of the present invention, wherein a cross-section of the rail is U-shaped, L-shaped or C-shaped.

According to an embodiment of the present invention, wherein the power converter comprises a plurality of power modules. A plurality of main air duct modules and a plurality pairs of rails are fixed to the support unit. Wherein the number of the main air duct modules is the same as the number of the power modules. The plurality of main air duct modules are in a mirror-symmetrical and back-to-back arrangement.

According to an embodiment of the present invention, the heat-dissipating type of power converter further comprises a same number of fans corresponding to the main air duct modules as that of the power modules. Wherein the fans and the main air duct modules are mounted to two opposite sides of the support unit respectively, and the fans is in a mirror-symmetrical arrangement.

According to an embodiment of the present invention, the heat-dissipating type of power converter further comprises a wind-collecting hood connected to an end of the main air duct modules away from the support unit for collecting and discharging an airflow from the main air duct modules.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

The technical ideas of the present disclosure include modularizing the heat-dissipating type of power converter into power modules with the same structure to simplify the structure of the entire power converter and regularize the wiring; equipping power modules with rails, radiators and main air duct modules respectively; equipping rails for plugging or unplugging the power modules into or from the main air duct modules in convenience; equipping radiators for improving the dissipation efficiency of respective power modules; and/or equipping the radiator with corresponding main air ducts to improve the dissipation efficiency of the power module.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

First Embodiment

Figure 1:
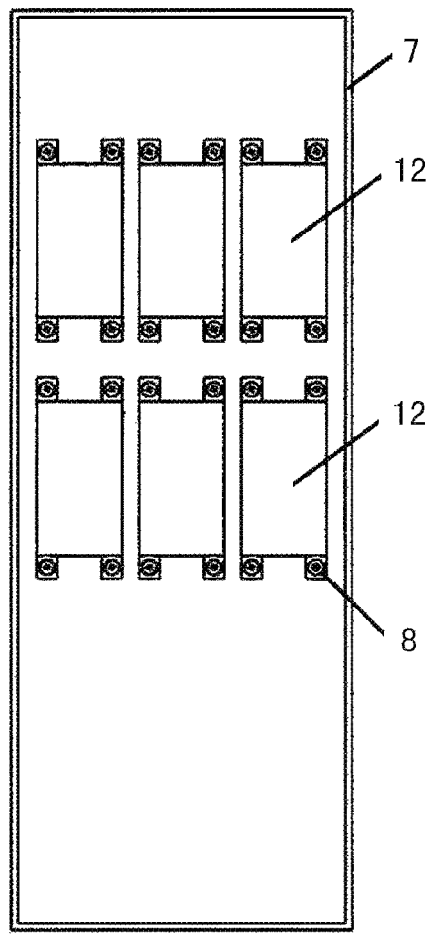
FIG. 1 is a schematic view of the heat-dissipating type of power converter in the prior art.

As shown in FIGS. 2A through 2D, the heat-dissipating type of power converter in the first embodiment of the present invention includes a power module 1, a main air duct module 3, a support unit 4, a pair of rails and a fan 5.

The pair of rails include a left rail 46 and a right rail 47 parallel to each other are fixed to the support unit 4. The main air duct module 3 is fixed to the upper surface of the support unit 4, stands between the left rail 46 and right rail 47, and is fixed away from the starting position of the rails. One side of the main air duct module 3 toward the power module is provided with a second opening. The fan 5 is mounted to the support unit 4 opposite to the main air duct module 3. The portion of the support unit 4 covered by the main air duct module 3 is provided with a third opening, through which the fan 5 blows airflow into the main air duct module 3. The power module 1 slides along the left rail 46 and the right rail 47, being combined to or separated from the main air duct module 3 through the second opening.

Figure 2A:
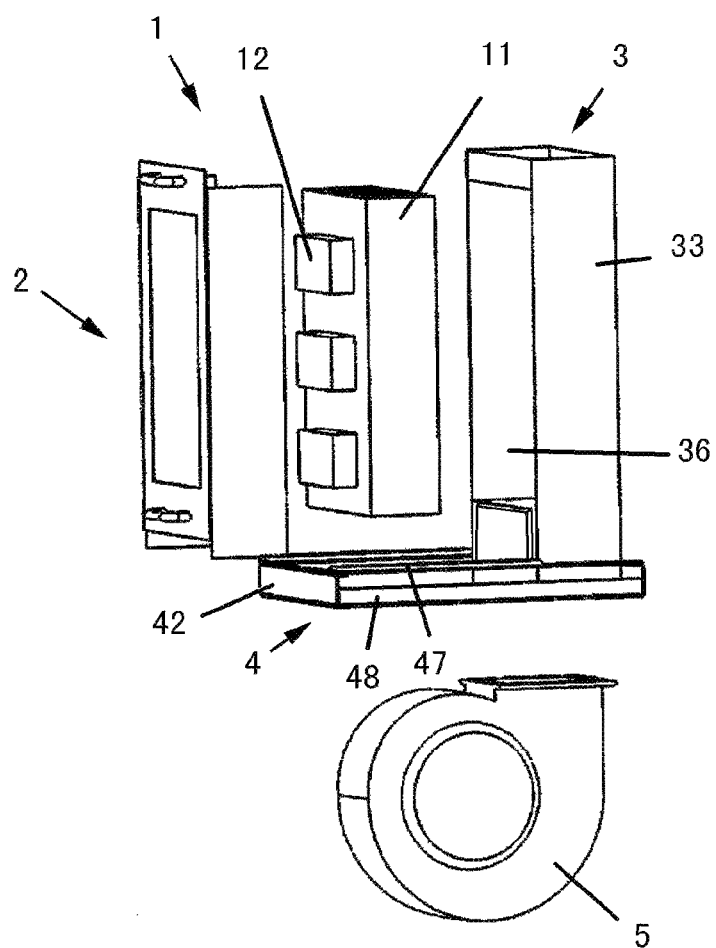
FIG. 2A is an exploded perspective view of the heat-dissipating type of power converter in the first embodiment.

The power module 1 includes a mounting plate module 2, a radiator 11 and the power unit fixed to the radiator 11. As shown in FIGS. 3A and 3B, in the heat-dissipating type of power converter in the first embodiment, the radiator 11 is a traditional extrusion type of radiator (shown in FIG. 3A). With reference to FIG. 2, the radiator 11 has a rectangular block shape with the width direction oriented along the rails. In the heat-dissipating type of power converter in the first embodiment, the height of the radiator is larger than the length or width thereof. However, the length, height, and width of the radiator are not limited thereto. The radiator 11 can also be selected from the blade-combination type (as shown in FIG. 3B) or other type of radiators.

As show in FIGS. 2A through 2D, in the heat-dissipating type of power converter in the first embodiment, the power unit includes a plurality of power sub-unit 12. Only three power sub-units 12 are shown in these figures, and the number of the power sub-units 12 can be decreased or increased according to the requirement of power. Three power sub-units 12 are arranged in parallel on the front surface defined by the length and height of the radiator 11. The power unit includes conventional power devices such as the power switching device, the inductor or the capacitor, etc.

Figure 4A:
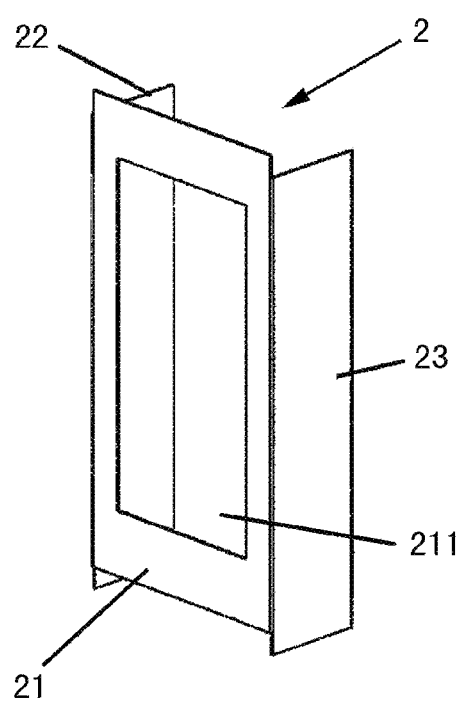
FIG. 4A is a perspective view of the mounting plate module of the heat-dissipating type of power converter in the first embodiment.

Referring to FIG. 4A, the mounting plate module 2 includes a panel 21, a left mounting plate 22 and a right mounting plate 23, in which the left mounting plate 22 and the right mounting plate 23 are vertically fixed to the panel 21 and parallel to each other. The first opening 211 is defined in the panel 21 to expose the power sub-units 12 of the power module 1. The panel 21 is connected with the left mounting plate 22 and the right mounting plate 23 in an mismatch manner. The portions of the left mounting plate 22 and the right mounting plate 23 close to the rails extend beyond the panel 21, i.e., the distance from the left and right mounting plates 22, 23 to the rails is less than that from the panel 21 to the rails, and the extending portions of the left mounting plate 22 and the right mounting plate 23 can slide along the rails as gliding feet. The end portion of the panel 21 away from the rails extends beyond the left mounting plate 22 and the right mounting plate 23, and the end portions of the left mounting plate 22 and the right mounting plate 23 away from the rails are aligned with the radiator 11 after the radiator 11 is embedded in the main air duct module 3. The panel 21 can totally cover the second opening provided in the main air duct module 3 to generally define a main air duct with airtight sidewall. In some other embodiments, the gliding feet of the mounting plate module can be designed for other styles. For example, the junctions of the panel 21 and the end portions of the left mounting plate 22 and the right mounting plate 23 are provided with grooves close to the rails for the rails settled therein. Therefore, the person skilled in the art can use various designs for the mounting plate module and the rail, without being limited to these exemplified constructions of the mounting plate module.

Figure 4B:
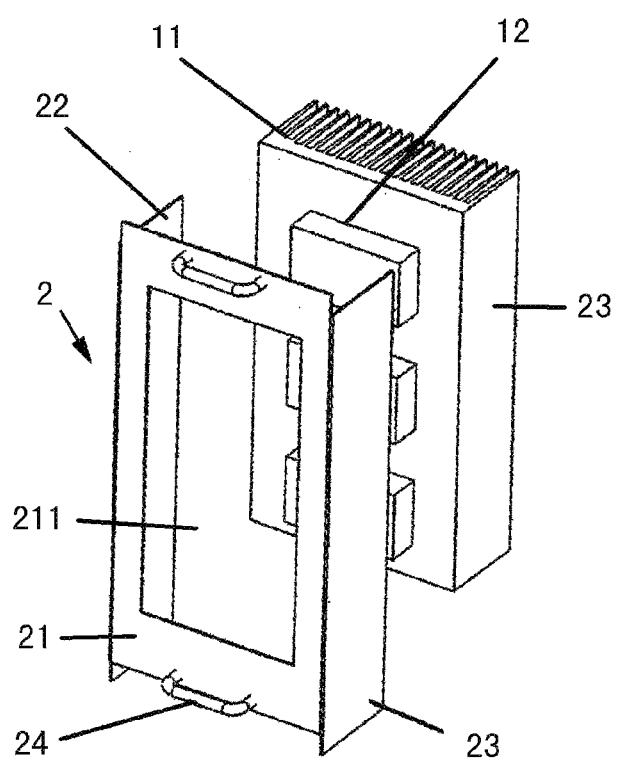
FIG. 4B is a perspective view of the assembling of the mounting plate module and the radiator of the heat-dissipating type of power converter in the first embodiment.
Figure 4C:
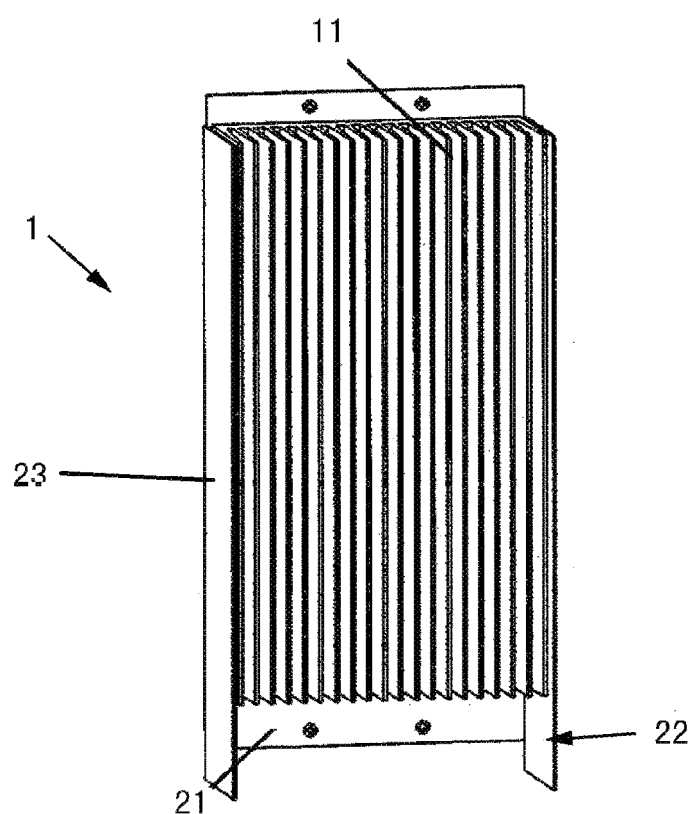
FIG. 4C is a perspective back view of the heat-dissipating type of power converter after assembling of the mounting plate module and the radiator in the first embodiment.

As shown in FIGS. 4B and 4C, in the power module 1, the mounting plate module 2 is fixedly connected to the radiator 11 through a fastener such as a bolt or a screw, or through the adhesive or any other manners. In order to push and pull the power module 1 more easily and more labor-saving, two handles 24 can also be installed onto the panel 21. For example, two handles 24 are installed to the portion close to the rail and the portion away from the rail on the panel 21 respectively.

Figure 2B:
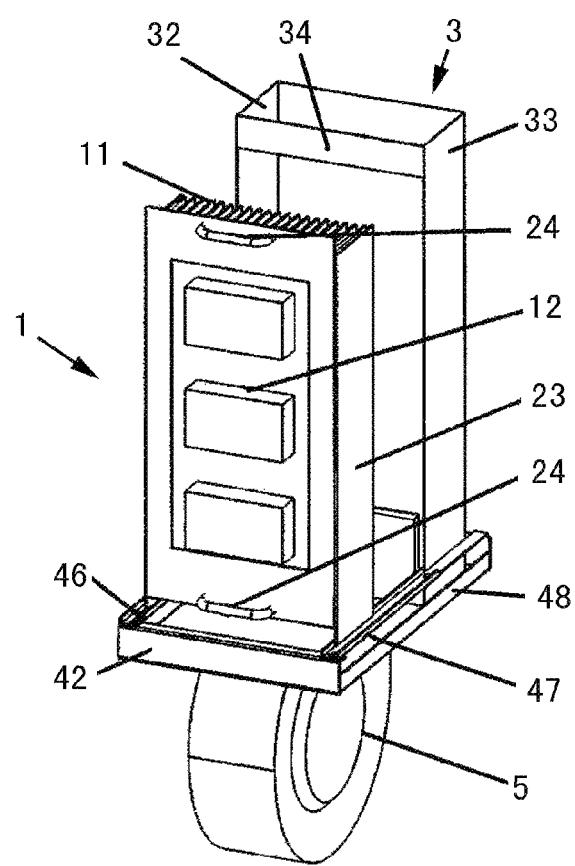
FIG. 2B is a perspective view of the heat-dissipating type of power converter in the first embodiment.
Figure 2C:
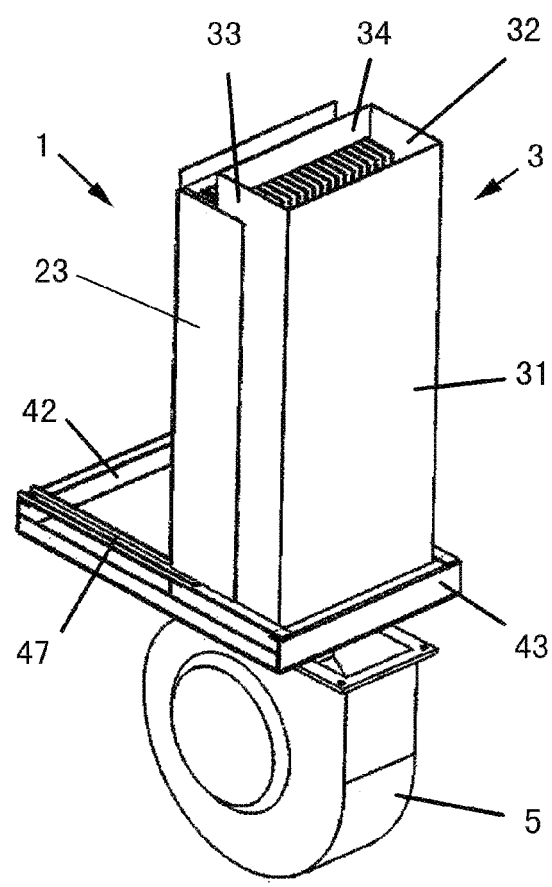
FIG. 2C is a schematic view of the heat-dissipating type of power converter in the first embodiment.
Figure 2D:
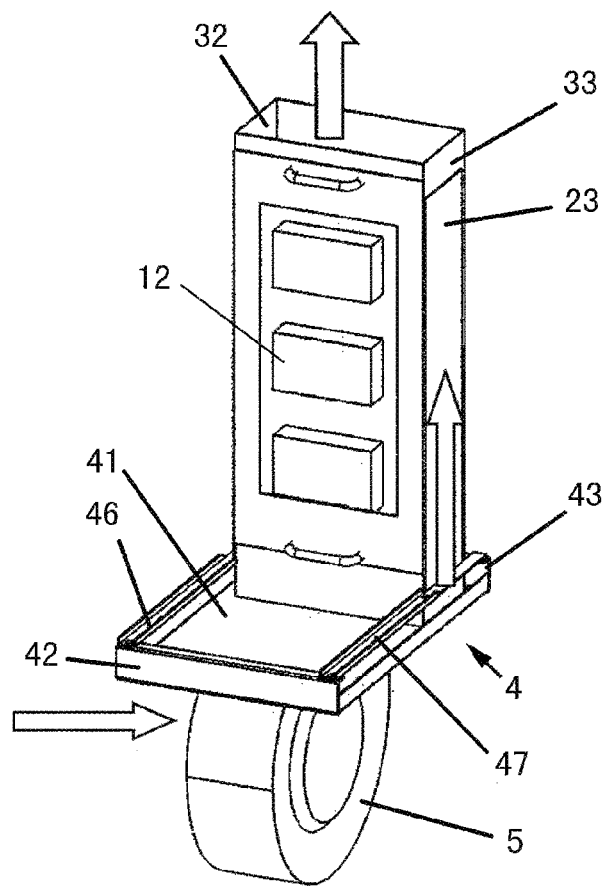
FIG. 2D is a perspective view of the assembled heat-dissipating type of power converter in the first embodiment.
Figure 3A:
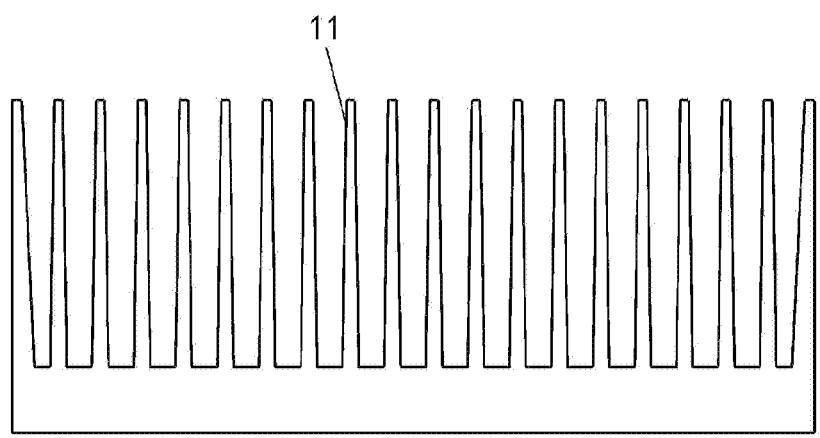
FIG. 3A a schematic view of one type of radiator for the heat-dissipating type of power converter in the first embodiment.
Figure 3B:
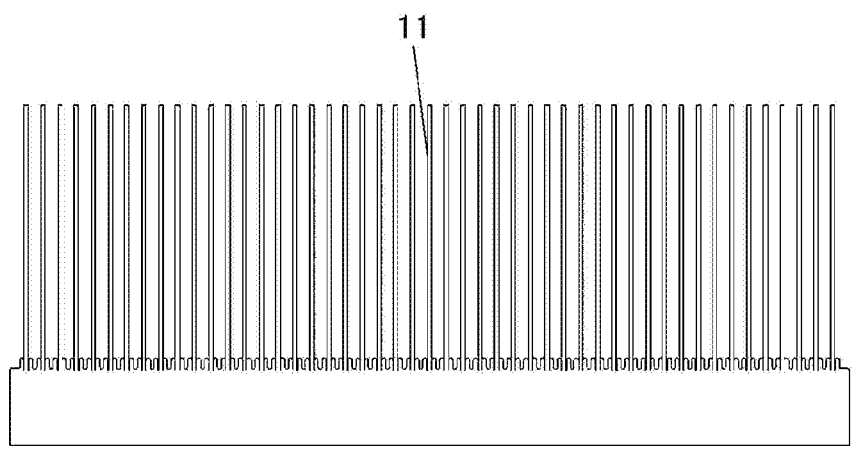
FIG. 3B a schematic view of another type of radiator for the heat-dissipating type of power converter in the first embodiment.

Referring to FIGS. 2B, 2C and 2D, the support unit 4 in the first embodiment includes a base plate 41, a front plate 42 vertically fixed to the base plate 41 for supporting the starting portions of the rails, a rear plate 43 vertically fixed to the base plate 41 for supporting the ending portions of the rails. The front ends of the left and right rails 46, 47 are fixed to the front plate 42, the rear end of that are fixed to the rear plate 43. The left and right rails 46, 47 guide the power module 1 close to the main air duct module 3, and perform the function of positioning and orientation. The rails are the foundation to ensure plugging and unplugging the power module 1 in convenience. The cross-sections of the left and right rail 46 and 47 can be L-shaped, C-shaped or U-shaped. The rail with the U-shaped cross-section in the first embodiment has a good strength and a relatively compact structure. In order to further enhance the strength of the support unit 4, the reinforcing beams 48 can be provided on the base plate 41 and between the rear plate 43 and the front plate 42. It is only an exemplification for the support unit 4 as mentioned above, the present invention is not limited thereto. Thus, the support unit 4 can also have any other structural forms. For instance, instead of providing the front plate 42 and the rear plate 43 on the base plate 41, the left and right rails 46, 47 can be directly fixed to two sides of the base plate 41, or a plate sheet is provided on two sides of the base plate 41 with the left and right rails 46, 47 on the plate sheet.

Figure 5A:
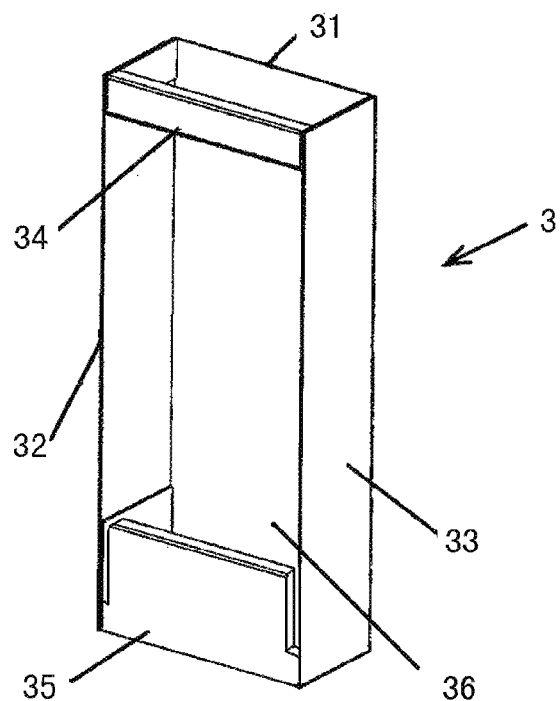
FIG. 5A is a perspective view of the main air duct module of the heat-dissipating type of power converter in the first embodiment.

Referring to FIGS. 2A and 5A, the main air duct module 3 in the first embodiment has a rectangular block shape with the width direction oriented along the rails, the length direction oriented perpendicular to the rails, and the height direction along the standing direction of the main air duct module 3. The main air duct module 3 includes a back plate 31, a left-side plate 32, a right-side plate 33, a first closure plate 34 and a second closure plate 35. The left-side plate 32 and the right-side plate 33 are parallel to each other, perpendicular to the back plate 31 and arranged along the length direction of the main air duct module 3. The first closure plate 34 and the second closure plate 35 are in perpendicular connection with the left-side plate 32 and the right-side plate 33, coplanar with the second opening and parallel to the back plate 31. The first closure plate 34 and the second closure plate 35 may be integral with the other member of the main air duct module 3 or be in separate structure. For example, the first closure plate 34 and the second closure plate 35 are U-shaped with opposite ends thereof fixed to the inner of the left-side plate 32 and the right-side plate 33 of the main air duct module 3. The separate structure of the first closure plate 34 and the second closure plate 35 is beneficial to the strength of the main air duct module 3. The second closure plate 35 is also in perpendicular connection with the support unit 4. Therefore, the main air duct module 3 is a unclosed air duct penetrating from upper to lower with a second opening 36 defined in the front sidewall (toward the power module 11). The second closure plate 35 is fixed to the left-side plate 32 and the right-side plate 33 only at the lower portions thereof (close to the plane defined by the support unit 4 and the rails), and two gaps are provided between the upper portion (close to the second opening 36) of the second closure plate 35 and the left-side plate 32 and the right-side plate 33, respectively. The width of the above gaps is slightly larger than the thickness of the left mounting plate 22 or the right mounting plate 23, in order to plug the left mounting plate 22 and the right mounting plate 23 into the main air duct module 3 through the above gaps smoothly, conveniently, and labor-saving (referring to FIG. 5E). Without consideration of the factors such as the design tolerance and manufacturing accuracy, the width of the gap may be equal to the width of the left mounting plate 22 or the right mounting plate 23 of the mounting plate module, so that ensuring to plug the left mounting plate 22 and the right mounting plate 23 into the main air duct module 3 through the above gaps and maximally meeting the requirement for the air-tightness of the main air duct module 3. Based on the consideration of the airtight requirement of the main air duct module 3, the width of the gap should not be too large to prevent from employing an additional seal to enhance the air-tightness of the main air duct module 3 and resulting in a complicated structure of the entire power converter device.

Figure 5B:
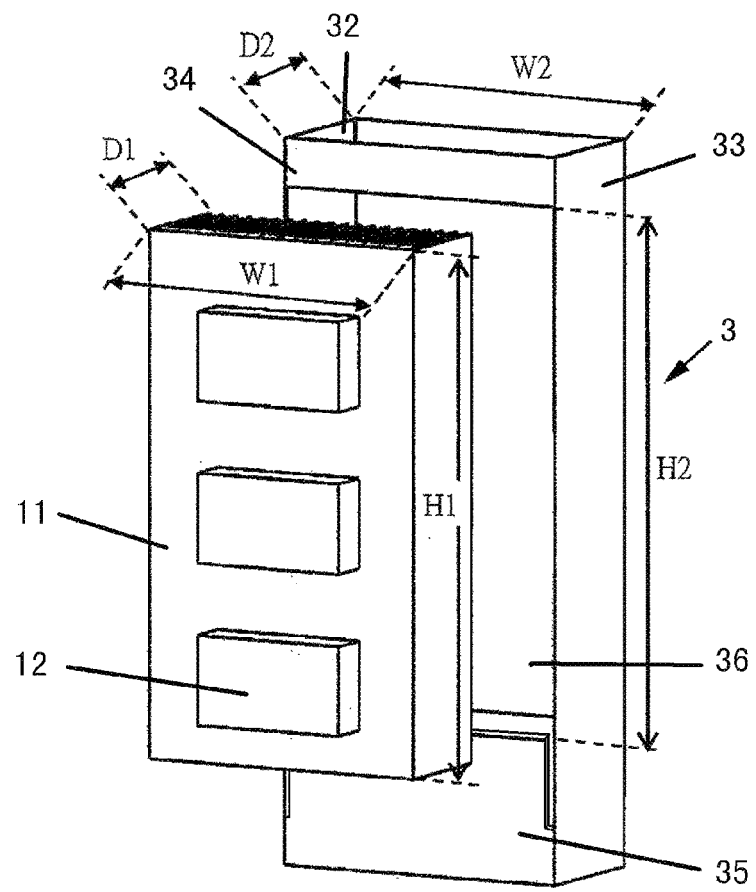
FIG. 5B is a perspective view of the size relationship between the main air duct module and the radiator of the heat-dissipating type of power converter in the first embodiment.

Referring to FIG. 5B, the size matching relation of the radiator 11 and the main air duct module 3 is as following: the height H1 of the radiator is less than the distance H2 from the first closure plate 34 to the second closure plate 35 of the main air duct module 3, i.e., less than the height of the second opening 36; the length W1 of the radiator 11 is less than the length W2 (equal to the distance from the left-side plate 32 to the right-side plate 33) of the main air duct module 3; the width D1 of the radiator is less than the width D2 (equal to the distance from the back plate 31 to the first closure plate 34 or to the second closure plate 35) of the main air duct module 3. With this size matching relation, the radiator 11 in the first embodiment can be pushed into the main air duct module 3 through the second opening 36.

Figure 5C:
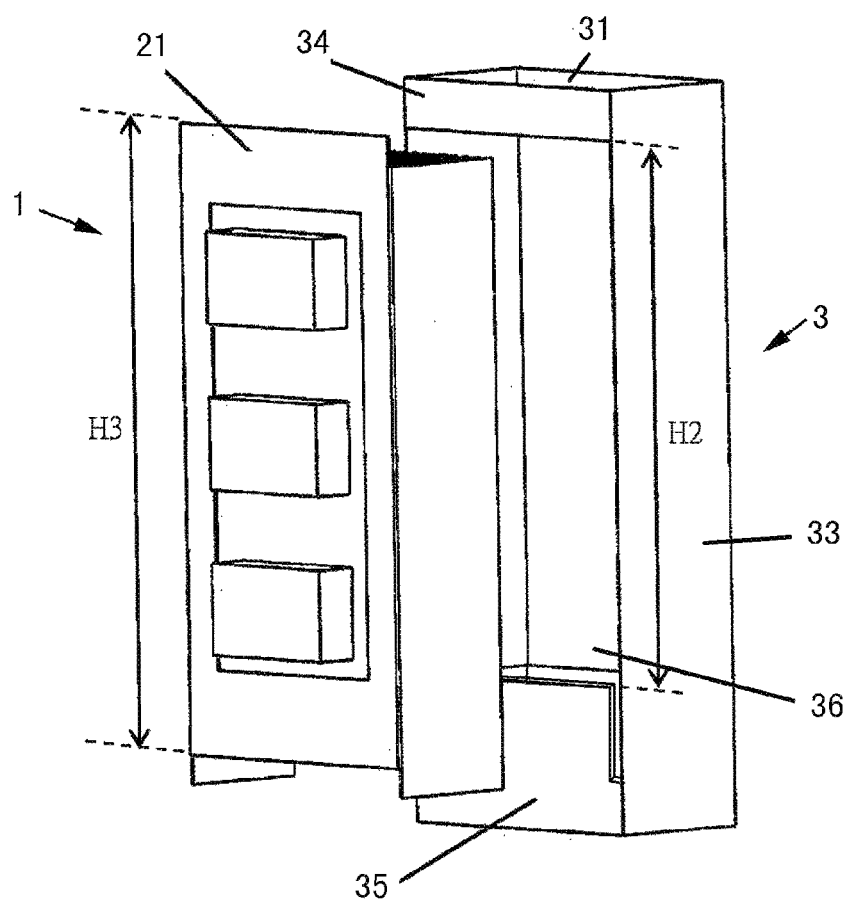
FIG. 5C is a perspective view of the size relationship between the main air duct module and the power module of the heat-dissipating type of power converter in the first embodiment.

Referring to FIG. 5C, the height H3 of the panel 21 of the mounting plate module 2 is larger than the distance H2 from the first closure plate 34 to the second closure plate 35 of the main air duct module 3, i.e., larger than the height of the second opening 36. After assembling of the mounting plate module 2 with the main air duct module 3 in the first embodiment, the panel 21 of the mounting plate module 2 covers the second opening 36 of the main air duct module 6. In other words, there are overlap regions between the panel 21 and the first closure plate 34 and between the panel 21 and the second closure plate 35, and the main air duct is formed to have a bottom-to-top through structure with the second opening 36 being covered. After embedment of the radiator 11 of the power module 1 into the main air duct module 3, the mounting plate module 2 of the power module 1 is fixed to the main air duct module 3. Thus, when the airflow is conducted through the main air duct, the power module is prevented from being pushed out of the main air duct module 3 by the airflow pressure. For unplugging the power module 1, it is required to remove the fasteners and thus separate the power module 1 from the main air duct module 3.

However, there can be a variety ways of assembling between the power module 1 and main air duct module. Two kinds of specific assembling between the power module 1 and main air duct module 3 will be illustrated as following. The scope of the present disclosure should not be limited to this embodiment, but subject to the claimed scope.

Figure 5D:
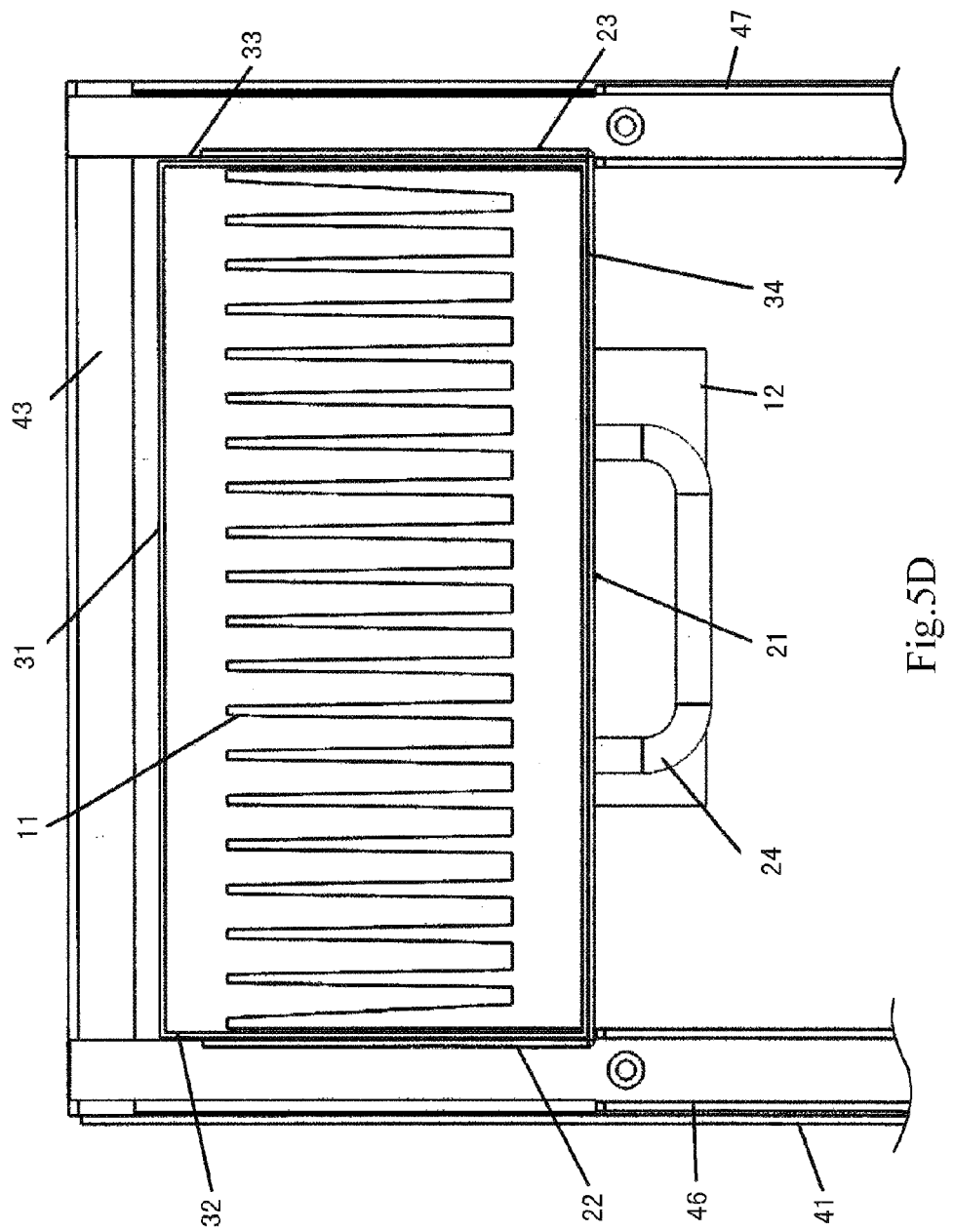
FIG. 5D is a top view showing a first manner of assembling between the power module and the main air duct module of the heat-dissipating type of power converter in the first embodiment.

Referring to FIGS. 5B and 5D, FIG. 5D shows a first exemplary manner of assembling of the power module 1 and the main air duct module 3

As shown in 5B, the length W1 of the radiator 11 of the power module 1 is less than the length W2 of the main air duct module 3.

As shown in FIG. 5D, in the first exemplary manner of assembling of the power module 1 and the main air duct module 3, the distance from the left mounting plate 22 to the right mounting plate 23 of the mounting plate module 2 in the power module 1 is slight larger than the sum of the distance between two side mounting plates and the thicknesses of two side mounting plates. As a result, the left-side plate 32 of the main air duct module 3 is plugged between the radiator 11 and the left mounting plate 22 of the mounting plate module 2, and the right-side plate 33 of the main air duct module 3 is plugged between the radiator 11 and the right mounting plate 23.

Figure 5E:
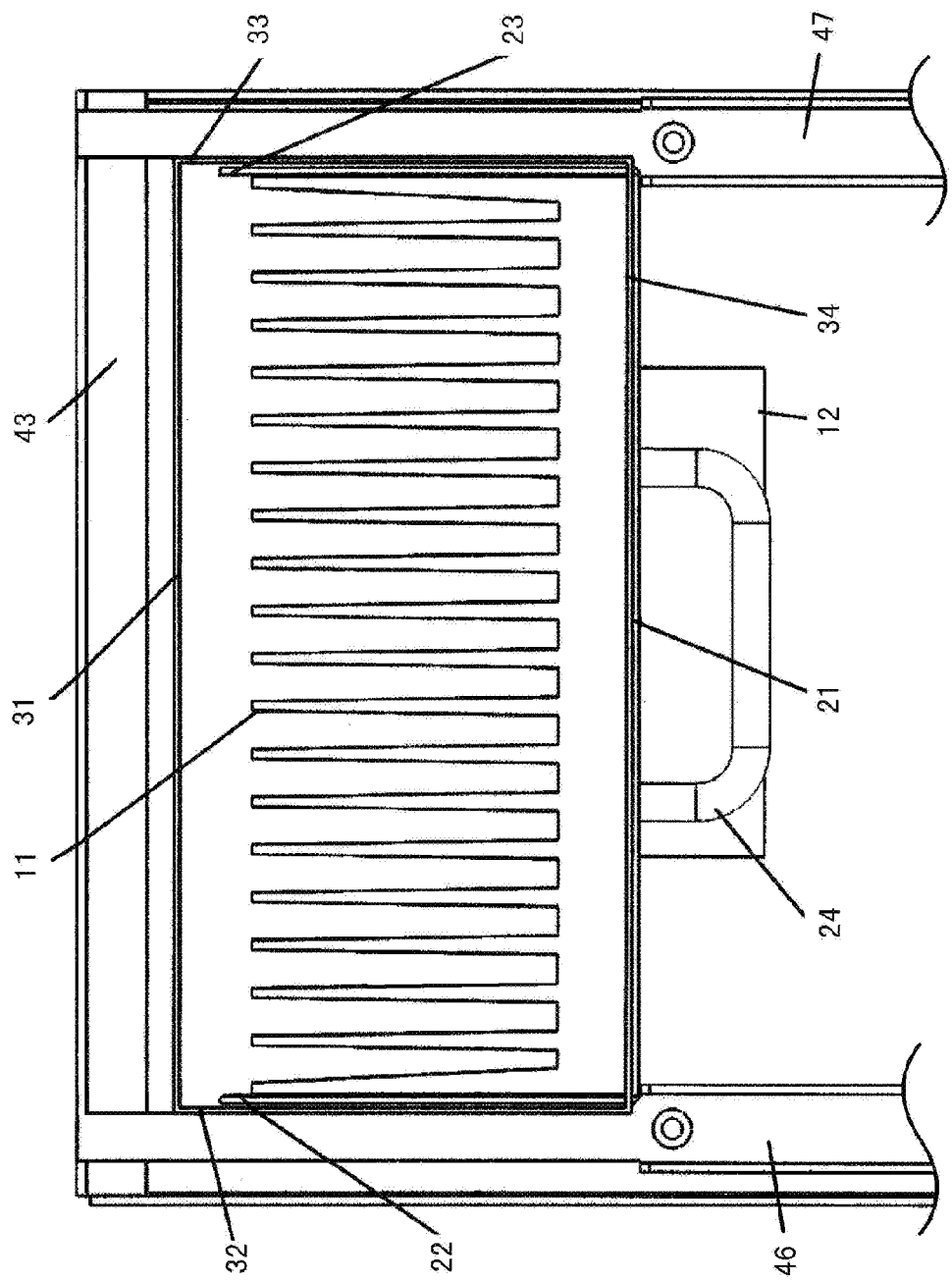
FIG. 5E is a top view showing a second manner of assembling between the power module and the main air duct module of the heat-dissipating type of power converter in the first embodiment.

Referring to FIG. 5E, FIG. 5E, it shows a second exemplary manner of assembling of the power module 1 and the main air duct module 3. In the second exemplary manner of assembling of the power module 1 and the main air duct module 3, the length W2 of the main air duct module 3 is slightly larger than the sum of the distance between the left mounting plate 22 and the right mounting plate 23, the thickness of the left mounting plate 22 and the thickness of the right mounting plate 23. The left mounting plate 22 and the right mounting plate 23 of the mounting plate module 2 are plugged between the radiator 11 and the main air duct module 3, respectively.

In the first exemplary manner of assembling between the power module 1 and the main air duct module 3, the structure of the main air duct module 3 can be also be modified. For example, the first closure plate 34 and the second closure plate 35 can be omitted from the main air duct module. The front side of the main air duct module 3 facing the power module 1 is open. In this case, it is completely reliant on the rails to assemble or disassemble the power module 1 to or from the main air duct module 3. If the structure of the main air duct module is the same as that described in the above embodiment, that is, the main air duct module includes the first closure plate 34 and the second closure plate 35, the assembling or disassembling of the power module 1 with or from the main air duct module 3 can be achieved in part by means of the sliding of the gliding feet of the mounting plate module 2 relative to the rail, and in part by means of the sliding of the radiator 11 relative to the second closure plate 35.

Figure 5F:
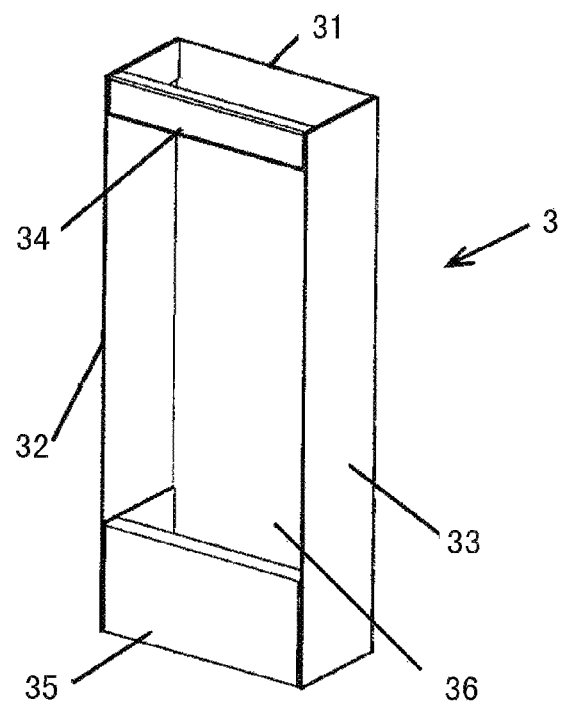
FIG. 5F is a perspective view of the main air duct module of the heat-dissipating type of power converter in the first embodiment.

Similarly, in the second kind of assembly between the power module 1 and the main air duct module 3, the structure of the main air duct module can be adjusted as that mentioned above, and it is unnecessary to go into details. In addition, the main air duct module 3 shown in FIG. 5F can be provided in the second kind of assembly between the power module 1 and the main air duct module 3. Without the gaps between the second closure plate 35 and the left-side plate 32, the right-side plate 33. It is beneficial to enhance the air-tightness and the strength of the main air duct module.

Thus, the rails is designed to correspond to different structure of the main air duct module 3 or different manner of assembling of the main air duct module 3 and the power module 1, so as to form the main air duct with the sealed sidewall after the assembling of the main air duct module 3 and the power module 1.

In the first embodiment, a third opening is defined in the support unit 4 to dissipate heat from the power module 1. Referring to anyone from FIGS. 2A to 2D, the third opening is exactly positioned at the portion of the support unit covered by the main air duct module 3 (not shown in figure). The fan 5 is positioned on the opposite side of the support unit 4 to the main air duct module 3. The outlet of the fan 5 is in airtight connection with the third opening. Thus, the airflow conducted by the fan 5 enters the main air duct to dissipate heat from the radiator 11 therein. The third opening can be formed during manufacturing the support unit 4 or on site during installing the fan 5 according to the shape and size of the outlet of the fan 5.

Second Embodiment

Figure 6A:
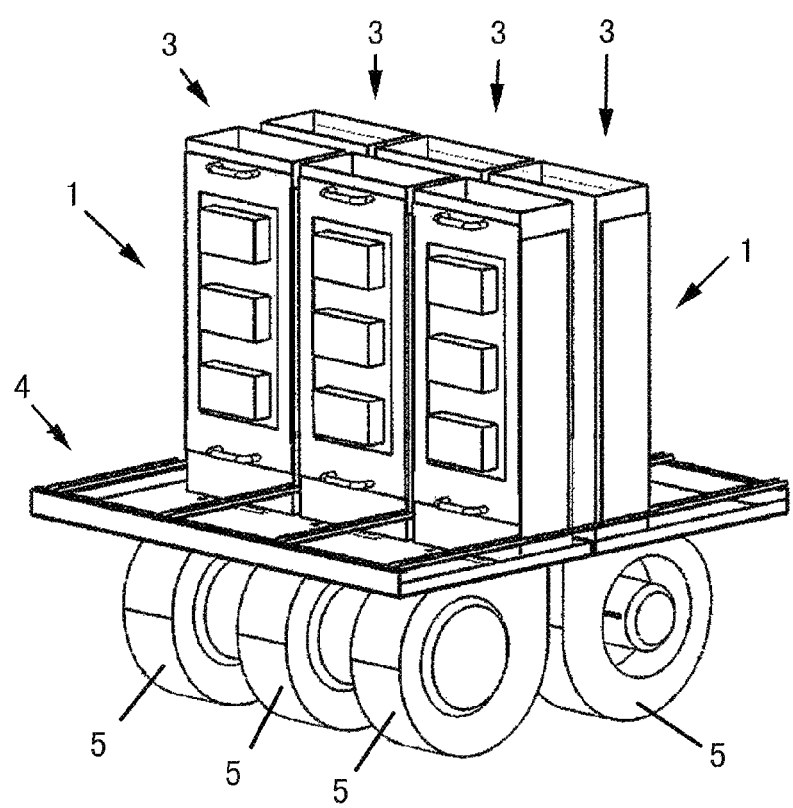
FIG. 6A is a perspective view of the heat-dissipating type of power converter in the second embodiment.
Figure 6B:
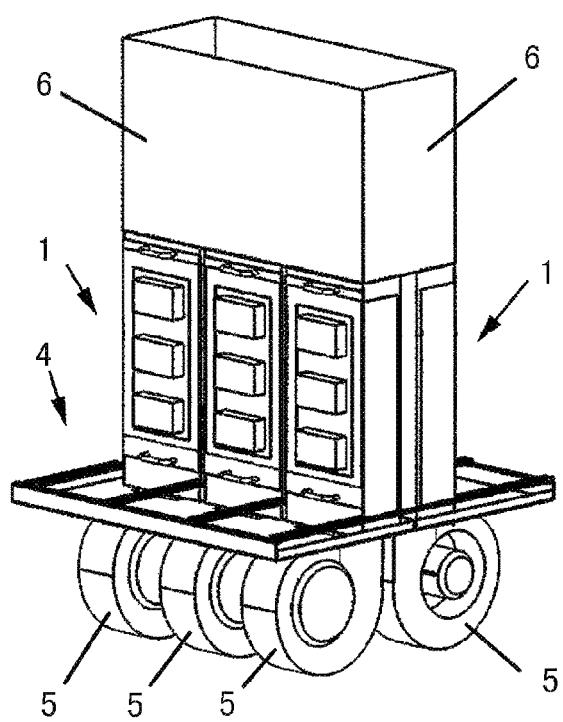
FIG. 6B is a perspective view of the heat-dissipating type of power converter provided with one type of wind-collecting hood in the second embodiment.
Figure 6C:
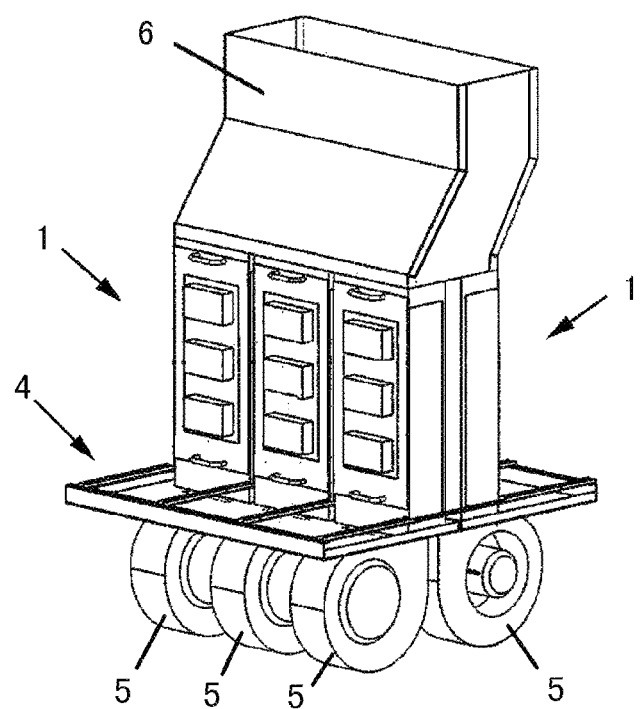
FIG. 6C is a perspective view of the heat-dissipating type of power converter provided with another type of wind-collecting hood in the second embodiment.

FIGS. 6A, 6B and 6C show the heat-dissipating type of power converter of the second embodiment of the present invention. In the first embodiment, the heat-dissipating type of power converter includes one power module 1, one main air duct module 3 and a pair of rails. Different from that in the first embodiment, the heat-dissipating type of power converter in the second embodiment includes a plurality of the power modules 1, the main air duct modules 3 and rails. The number of the main air duct module 3 is the same as that of the power module 1.

There are six power modules 1 shown in FIGS. 6A through 6C. Six main air duct modules 3 are divided into two rows with a mirror-symmetrical arrangement. Six power modules are divided into two rows corresponding to the main air duct modules 3. As show in FIG. 6C, there are three main air duct modules and three power modules in each row. Two back to back power modules 1 share one pair of rails, two adjacent power modules share one rail, and only two pairs of rails are required in the embodiment shown in FIG. 6C. As shown in FIGS. 6A to 6C, the heat-dissipating type of power converter in the second embodiment further includes the same number of fans as the number of the power modules. The fans and the main air duct modules are respectively mounted on two opposite sides of the mounting unit, with one fan corresponding to one main air duct module. As shown in FIG. 6B or 6C, the heat-dissipating type of power converter further includes a wind-collecting hood 6 mounted over six main air duct modules 3, for collecting and discharging the airflow in six main air duct modules 3. The wind-collecting hood 6 may be a tube in a straight form (shown in FIG. 6B) or a bent form in a certain angle (shown in FIG. 6C). The rest of the second embodiment is the same as that of the first embodiment, it is detailed description therefore is omitted.

In the first and second embodiments, the power unit in the power module is the power part of the voltage source converter. However, the present disclosure is not limited thereto. The power unit may also be the power part of other kinds of products. According to the technical solution described in the present disclosure, in the bulky power products such as the voltage source converter, the power module can be plugged and unplugged conveniently to facilitate the assembling, disassembling and maintenance of the entire heat-dissipating type of power converter. On the other hand, the good dissipative channel is provided for the high power products such as the voltage source converter, which is beneficial to the enhanced dissipative effect of the entire heat-dissipating type of power converter.

One or more exemplary embodiments of the invention have at least one or more of the following advantages and benefits:

It is possible to modularize the power converter and provide the rail corresponding to each power module for assembling or disassembling.

The power module can be plugged and unplugged freely to facilitate the assembling, disassembling and maintenance of the entire power converter.

Each power module can be provided with a radiator and a main air duct for dissipation. Thus, the cooling capacity of the entire power converter is improved. As a result, the power converter is more suitable for the circumstance with high requirement for heat dissipation, such as where a medium or large-sized power converter is needed.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

And it should be noted that the above embodiments is only illustrated for describing the technical solution of the invention and not restrictive, and although the invention is described in detail by referring to the aforesaid embodiments, the skilled in the art should understand that the aforesaid embodiments can be modified and portions of the technical features therein may be equally changed, which does not depart from the spirit and scope of the technical solution of the embodiments of the invention.

What is claimed is:

1. A heat-dissipating type of power converter comprising:
   a unitary support unit;
   at least one pair of rails fixed to an entirety of the support unit and parallel to each other;
   at least one main air duct module fixed to the same support unit as the at least one pair of rails, wherein the main air duct module is positioned between the pair of rails, and the main air duct module has an opening defined therein; and
   at least one power module comprising a mounting plate module, a power unit and a radiator, wherein the power unit is fixed to the radiator, and the mounting plate module is fixed to the radiator;
   wherein
   the power module is configured to be assembled with or disassembled from the main air duct module by sliding along the pair of rails, and
   when the power module is assembled with the main air duct module, the radiator is plugged into the main air duct module through the opening of the main air duct module, the power unit is positioned outside the main air duct module, and a main air duct with a sealed sidewall is defined by the mounting plate module, the radiator and the main air duct module.

2. The power converter according to claim 1, wherein the radiator has a shape of rectangular block with a width direction oriented along the rails.

3. The power converter according to claim 1, wherein the power unit comprises a plurality of power sub-units arranged in parallel on a surface of the radiator connected to the mounting plate module.

4. The power converter according to claim 1, wherein
   the main air duct module has a shape of rectangular block with a width direction oriented along the rails, a length direction perpendicular to the rails and a height direction consistent with a standing direction of the main air duct module,
   two parallel side plates are provided along the length direction of the main air duct module, and
   a width of the main air duct module is larger than a width of the radiator.

5. The power converter according to claim 4, wherein the main air duct module comprises a first closure plate and a second closure plate respectively arranged at two opposite sides of the opening of the main air duct module along the height direction of the main air duct module, the first closure plate and the second closure plate are fixed to two side plates of the main air duct module respectively, and the second closure plate is fixed to the support unit.

6. The power converter according to claim 5, wherein
   the mounting plate module comprises a panel having an opening for the power unit passing through and being fixed to a side of the radiator provided with the power unit, and
   after the radiator is plugged into the main air duct module, overlap regions are defined between the panel and the first and second closure plates, and a fastener is provided at the overlap regions to fix the power module to the main air duct module.

7. The power converter according to claim 6, wherein the mounting plate module further comprises two parallel side mounting plates adjacent to the panel, a distance between two side plates of the main air duct module is larger than that between the two side mounting plates.

8. The power converter according to claim 7, wherein a length of the main air duct module is slightly larger than a sum of the distance between the two side mounting plates and a total thickness of the two side mounting plates, wherein the two side mounting plates are positioned between two side plates of the main air duct module.

9. The power converter according to claim 7, wherein there are gaps between the upper portion of the second closure plate of the main air duct module and two side plates respectively.

10. The power converter according to claim 6, wherein the mounting plate module further comprises two parallel side mounting plates adjacent to the panel, and a distance between two side mounting plates is larger than that between two side plates of the main air duct module.

11. The power converter according to claim 10, wherein the distance between two side mounting plates is slightly larger than a sum of the distance between two side plates of the main air duct module and a total thickness of two side plates, and wherein after the radiator is plugged into the main air duct module, the two side plates of the main air duct module are positioned between the two side mounting plates.

12. The power converter according to claim 1, wherein the mounting plate module comprises a panel and two parallel side mounting plates adjacent to the panel, the panel having an opening for the power unit passing through and being fixed to a side of the radiator provided with the power unit, and
wherein the radiator is mounted between the two side mounting plates.

13. The power converter according to claim 12, wherein one handle is provided to a portion of the panel close to the rails, and another handle is provided to a portion of the panel away from the rails.

14. The power converter according to claim 1, wherein the mounting plate module further comprises two parallel side mounting plates adjacent to the panel, a distance from two side mounting plates to a plane defined by the rails is less than that from the panel to the plane defined by the rails.

15. The power converter according to claim 1, wherein the power converter further comprises at least one fan, the fan and the main air duct module being mounted to two opposite sides of the support unit; and at least one third opening is defined in the support unit for conducting an airflow into the main air duct module by the fan.

16. The power converter according to claim 1, wherein the power unit is a voltage source converter.

17. The power converter according to claim 1, wherein a cross-section of the rail is U-shaped, L-shaped or C-shaped.

18. The power converter according to claim 1, wherein the power converter comprises a plurality of power modules, a plurality of main air duct modules and a plurality pairs of rails are fixed to the support unit, wherein the number of the main air duct modules is the same as the number of the power modules, and wherein the plurality of main air duct modules are in a mirror-symmetrical and back-to-back arrangement.

19. The power converter according to claim 18, further comprising a same number of fans corresponding to the main air duct modules as that of the power modules, wherein the fans and the main air duct modules are mounted to two opposite sides of the support unit respectively, and the fans is in a mirror-symmetrical arrangement.

20. The power converter according to claim 18, further comprising a wind-collecting hood connected to an end of the main air duct modules away from the support unit for collecting and discharging an airflow from the main air duct modules.

* * * * *